(12) United States Patent
Connell et al.

(10) Patent No.: US 7,022,418 B2
(45) Date of Patent: Apr. 4, 2006

(54) FABRICATION OF STACKED MICROELECTRONIC DEVICES

(75) Inventors: Michael Connell, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 10/933,794

(22) Filed: Sep. 2, 2004

(65) Prior Publication Data

US 2005/0026415 A1 Feb. 3, 2005

Related U.S. Application Data

(62) Division of application No. 10/051,890, filed on Jan. 16, 2002.

(51) Int. Cl.
*H01L 21/44* (2006.01)
*H01L 21/50* (2006.01)

(52) U.S. Cl. ............... 428/621; 428/41.4; 428/42.3; 438/109; 438/114; 438/464; 156/249; 156/268; 156/299

(58) Field of Classification Search ............... 438/33, 438/109, 113, 114, 464, 976; 156/249, 299; 428/621, 41.4, 42.3
See application file for complete search history.

(56) References Cited

U.S. PATENT DOCUMENTS

| | | | |
|---|---|---|---|
| 5,098,501 A * | 3/1992 | Nishiguchi | 156/275.5 |
| 5,128,831 A | 7/1992 | Fox, III et al. | |
| 5,252,857 A | 10/1993 | Kane et al. | |
| 5,323,060 A | 6/1994 | Fogal et al. | |
| 5,397,634 A * | 3/1995 | Cahill et al. | 428/304.4 |
| 5,422,435 A | 6/1995 | Takiar et al. | |
| 5,518,957 A | 5/1996 | Kim | |
| 5,827,394 A * | 10/1998 | Lu | 156/344 |
| 5,883,426 A | 3/1999 | Tokuno et al. | |
| 5,926,951 A | 7/1999 | Khandros et al. | |
| 5,946,553 A | 8/1999 | Wood et al. | |
| 5,952,725 A | 9/1999 | Ball | |
| 5,986,209 A | 11/1999 | Tandy | |
| 5,990,566 A | 11/1999 | Farnworth et al. | |
| RE36,469 E | 12/1999 | Wood et al. | |
| 6,020,624 A | 2/2000 | Wood et al. | |
| 6,020,629 A | 2/2000 | Farnworth et al. | |
| 6,028,365 A | 2/2000 | Akram et al. | |

(Continued)

OTHER PUBLICATIONS

AI Technology, UV Releasing Tape, "Dicing & Lapping Tapes for Wafer and Substrate," http://www.aitechnology.com/dicingtape/prod03_uv_release_dice.htm, 3 pages, Nov. 12, 2001.

(Continued)

*Primary Examiner*—Mark A. Osele
(74) *Attorney, Agent, or Firm*—Perkins Coie LLP

(57) ABSTRACT

Manufacture of stacked microelectronic devices is facilitated by producing subassemblies wherein adhesive pads are applied to the back surfaces of a plurality of microelectronic components in a batch fashion. In one embodiment, an adhesive payer is applied on a rear surface of a wafer. A plurality of spaced-apart adhesive pads are defined within the adhesive layer. Each adhesive pad may cover less than the entire back surface area of the component to which it is attached. A mounting member (e.g., dicing tape) may be attached to the adhesive layer and, in some embodiments, the adhesive layer may be treated so that the mounting member is less adherent to the adhesive pads than to other parts of the adhesive layer, easing removal of the adhesive pads with the microelectronic components.

23 Claims, 7 Drawing Sheets

U.S. PATENT DOCUMENTS

| | | |
|---|---|---|
| RE36,613 E | 3/2000 | Ball |
| 6,051,878 A | 4/2000 | Akram et al. |
| 6,064,308 A | 5/2000 | Janning et al. |
| 6,072,233 A | 6/2000 | Corisis et al. |
| 6,072,236 A | 6/2000 | Akram et al. |
| 6,153,924 A | 11/2000 | Kinsman |
| 6,160,718 A | 12/2000 | Vakilian |
| 6,175,149 B1 | 1/2001 | Akram |
| 6,176,966 B1 * | 1/2001 | Tsujimoto et al. .......... 156/344 |
| 6,212,767 B1 | 4/2001 | Tandy |
| 6,225,194 B1 * | 5/2001 | Noguchi et al. ............ 438/464 |
| 6,225,689 B1 | 5/2001 | Moden et al. |
| 6,228,548 B1 | 5/2001 | King et al. |
| 6,235,554 B1 | 5/2001 | Akram et al. |
| 6,258,623 B1 | 7/2001 | Moden et al. |
| 6,261,865 B1 | 7/2001 | Akram |
| 6,262,895 B1 | 7/2001 | Forthun |
| 6,281,577 B1 | 8/2001 | Oppermann et al. |
| 6,294,839 B1 | 9/2001 | Mess et al. |
| 6,297,547 B1 | 10/2001 | Akram |
| 6,303,981 B1 | 10/2001 | Moden |
| 6,344,976 B1 | 2/2002 | Schoenfeld et al. |
| 6,351,028 B1 | 2/2002 | Akram |
| 6,514,795 B1 | 2/2003 | Jiang et al. |
| 6,552,910 B1 | 4/2003 | Moon et al. |
| 6,558,975 B1 | 5/2003 | Sugino et al. |
| 6,560,117 B1 | 5/2003 | Moon |
| 6,589,809 B1 * | 7/2003 | Koopmans .................... 438/68 |
| 6,620,649 B1 * | 9/2003 | Uchida ...................... 438/107 |
| 6,706,557 B1 | 3/2004 | Koopmans |
| 6,825,572 B1 | 11/2004 | Tian et al. |
| 6,896,760 B1 | 5/2005 | Connell et al. |
| 2002/0055238 A1 * | 5/2002 | Sugino et al. .............. 438/459 |
| 2003/0042615 A1 | 3/2003 | Jiang et al. |
| 2003/0162325 A1 | 8/2003 | Tan et al. |
| 2003/0178715 A1 | 9/2003 | Sturcken et al. |
| 2005/0026395 A1 | 2/2005 | Connell et al. |

OTHER PUBLICATIONS

Lintec-USA, UV Curable Adhesive, http://www.lintec-usa.com/Contents/Products/Tape/Uvad.htm, 3 pages, Nov. 12, 2001.

* cited by examiner

FABRICATION OF STACKED MICROELECTRONIC DEVICES

TECHNICAL FIELD

The present invention relates to methods and apparatus for increasing microelectronic component density. The invention has particular utility in connection with producing vertically superimposed, multi-component microelectronic devices in which at least one of the components is wire-bonded to a substrate.

BACKGROUND

Higher performance, lower cost, increased miniaturization of components, and greater packing density of integrated circuits are ongoing goals of the computer industry. Greater integrated circuit density is primarily limited by the space or "real estate" available for mounting microelectronic component on a substrate such as a printed circuit board. The microelectronic component may be electrically connected to circuitry on the circuit board via flip chip attachments, wire bonding, tape automated bonding (TAB), or a variety of other techniques.

Increasingly, microelectronic components are being vertically stacked atop one another to conserve valuable substrate real estate. In such a vertically stacked assembly, a first microelectronic component is attached directly to the substrate and a second microelectronic component may be physically attached to the first microelectronic component (e.g., stacked on the first microelectronic component). If the first microelectronic component is electrically connected to the substrate via flip chip attachments or TAB, the active surface of the microelectronic component (i.e., the surface bearing the electrical contacts for connection to the circuitry of the microelectronic component) faces toward the substrate. Commonly, the bare backside surface of the first microelectronic component is exposed and faces away from the substrate, and the second microelectronic component is attached directly to the backside surface.

If the first microelectronic component is electrically connected to the substrate by wire bonding, however, attachment of the second microelectronic component to the first microelectronic component can be more problematic. In wire-bonding techniques, the backside of the first microelectronic component is mounted to the substrate and the active surface of a wire bonded microelectronic component defines the outer surface which faces away from the substrate. The contacts on the active surface are then electrically coupled to the contacts on the substrate by small conductive "bonding" wires that extend from the active surface to the substrate. The wires that electrically connect the active surface of the microelectronic component to the substrate accordingly interfere with attaching the second microelectronic component directly on the active surface.

FIG. 1 schematically illustrates one current stacked microelectronic device in which the first and second microelectronic components are wire-bonded to the substrate. The stacked microelectronic device 100 of FIG. 1 includes a substrate 120 carrying a pair of microelectronic components 130 and 140. The substrate 120, which may be a circuit board or the like, has a contact surface 124 bearing a plurality of electrical contacts 126a–126d. A first microelectronic component 130 is attached to the component surface 124 of the substrate 120 by means of an adhesive 135. The adhesive 135 may cover the entire mounting face 132 of the first microelectronic component 130. The active surface 134 of the first microelectronic component 130 includes a plurality of electrical contacts 136a–136b. A first bonding wire 138a electrically connects the first electrical contact 136a of the first microelectronic component 130 to the first electrical contact 126a of the substrate 120, and a second bonding wire 138b electrically connects a second electrical contact 136b of the first microelectronic component 130 to a second electrical contact 126b of the substrate 120.

The second microelectronic component 140 is carried by the first microelectronic component 130. In some conventional stacked microelectronic devices, a facing surface 142 of the second microelectronic component is attached to the active surface 134 of the first microelectronic component 130 via an adhesive layer 145. This adhesive layer 145 conventionally has a thickness which is greater than the height to which the bonding wires 138 extend above the active surface 134 so the second microelectronic component 140 does not directly contact or rest against the bonding wires 138. Such a structure is shown in U.S. Pat. No. 5,323,060 (Fogal et al.), the entirety of which is incorporated herein by reference. Once the second microelectronic component 140 is in place, a first electrical contact 146a on the outer surface 144 of the second microelectronic component 140 can be electrically connected to a third electrical contact 126c carried by the substrate 120. Similarly, a second electrical contact 146b on the outer surface 144 can be electrically connected to a fourth electrical contact 126d carried by the substrate 20.

The stacked microelectronic device of FIG. 1 includes two microelectronic components 130 and 140. The same approach can be employed to stack three or more microelectronic components in a single microelectronic device. For example, a third microelectronic component (not shown) may be attached to the outer surface 144 of the second microelectronic component 140 using another adhesive layer similar to adhesive layer 145. The third microelectronic component can be joined to other electrical contacts carried by the substrate 120 (e.g., contacts 126e and 126f) or one of the other microelectronic components (e.g., contacts 146) via wire bonding.

The system proposed by Fogal et al. provides a relatively simple structure which enables stacking of microelectronic components to increase component density in a microelectronic device. However, a stacked microelectronic device such as that shown in FIG. 1 can present some manufacturing difficulties. For example, rapidly and precisely positioning the adhesive layer 145 and the second microelectronic component 140 can be a challenge. For this structure to work reliably, the adhesive layer 145 must be positioned within a central area of the first component's active surface 134 inside of the electrical contacts 136 of the first microelectronic component. If the adhesive layer 145 overlaps the electrical contacts 136, this can damage or interfere with the connection between the electrical contacts 136 and the associated bonding wires 138. Many microelectronic components, such as semiconductor dies, are fairly small. It can be difficult to consistently and unerringly position the adhesive layers 145 on previously mounted microelectronic components 130 in a rapid fashion to facilitate mass production of stacked microelectronic devices 100. After the adhesive layer 145 is applied, the next microelectronic component 140 must be accurately positioned on the adhesive layer 145. As the number of microelectronic components stacked atop one another in the microelectronic device increases, the chances for error increase concomitantly as one error in alignment or position of any layer of the stacked device can render the entire device unacceptable.

SUMMARY OF THE INVENTION

Embodiments of the present invention provide methods of preparing microelectronic components and of manufacturing stacked microelectronic devices. Other embodiments provide microelectronic subassemblies, which subassemblies may be useful in manufacturing stacked microelectronic devices.

One embodiment of the invention provides a method of preparing microelectronic components. In accordance with this method, an adhesive layer is applied on at least a portion of a rear surface of a microelectronic wafer. The adhesive layer has a first surface in contact with the rear surface of the wafer and a second surface oriented away from the wafer. A plurality of separable, spaced-apart adhesive pads are defined within the adhesive layer. The second surface of the adhesive layer is contacted with a mounting member. The wafer is diced into a plurality of microelectronic components, with each microelectronic component having a back surface to which at least one of the adhesive pads is attached. The microelectronic components and their attached adhesive pads are separated from the mounting member, leaving a remainder of the adhesive layer. In one adaptation of this embodiment, the adhesive layer may be selectively treated to yield a first adherence between the mounting member and the second surfaces of the adhesive pads and a second, greater adherence between the remainder of the adhesive layer and the mounting member.

In another embodiment, the invention provides a method of applying adhesive pads to a plurality of microelectronic components. This method includes applying an adhesive layer on at least a portion of a rear surface of a microelectronic wafer. The microelectronic wafer comprises a plurality of microelectronic components, each of which has a back surface. A plurality of separable, spaced-apart adhesive pads are defined within the adhesive layer. Each of the microelectronic components has an adhesive pad attached to its back surface, with the adhesive pad covering less than the entire back surface of the microelectronic component. The microelectronic components are singulated. If so desired, the adhesive layer may contact a mounting member prior to singulating the microelectronic components.

Other embodiments of the invention provide microelectronic subassemblies. One such subassembly includes a microelectronic wafer having an active surface and a rear surface. The wafer comprises a plurality of microelectronic components, each of which has a back surface. The wafer also includes a plurality of streets defining peripheries of the microelectronic components. An adhesive layer has a first surface in contact with the rear surface of the wafer and covering the back surfaces of the plurality of microelectronic components. The adhesive layer includes an array of separable adhesive pads separated by adhesive boundaries, each adhesive pad being in contact with the back surface of one of the microelectronic components. Each adhesive boundary is aligned with at least one of the streets of the wafer. If so desired, each adhesive pad may cover less than the entire back surface of the microelectronic component to which it is adhered.

A microelectronic subassembly in accordance with a different embodiment of the invention includes a microelectronic wafer comprising a plurality of microelectronic components. A mounting member has a mounting surface oriented toward a rear face of the wafer. An adhesive layer has a first surface adhered to the rear surface of the wafer and a second surface adhered to the mounting surface of the mounting member. The adhesive layer includes a plurality of adhesive pads separated by adhesive boundaries. Each of the adhesive pads is adhered to one of the microelectronic components. The mounting member is less adherent to the adhesive pads than to the adhesive boundaries.

DETAILED DESCRIPTION

Figure 1:
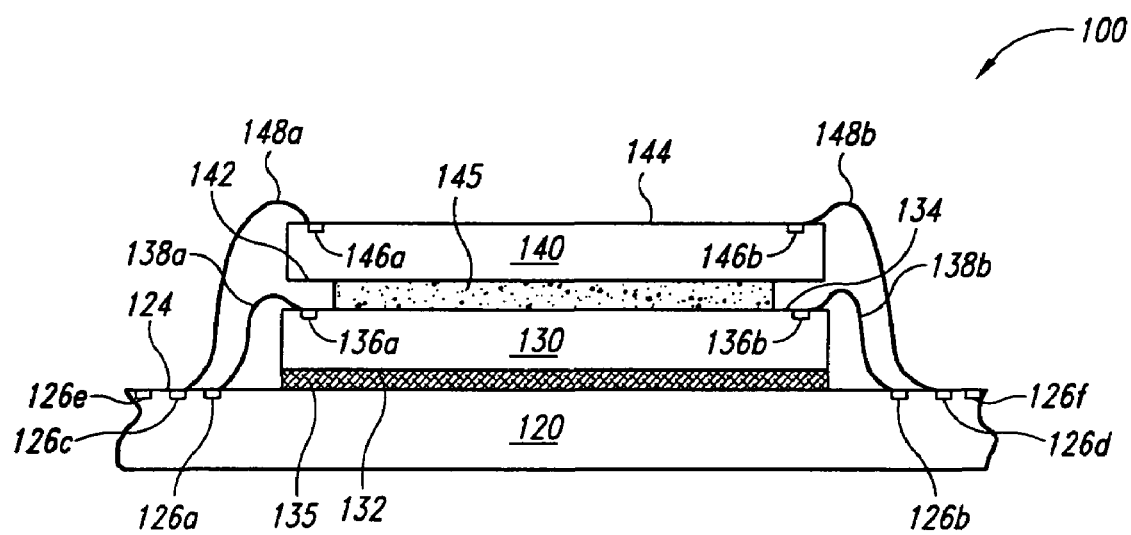
FIG. 1 is a schematic view of one conventional stacked microelectronic device employing a spacer between the microelectronic components.

Various embodiments of the present invention provide methods of manufacturing stacked microelectronic devices and subassemblies useful in such manufacture. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Figure 2A:
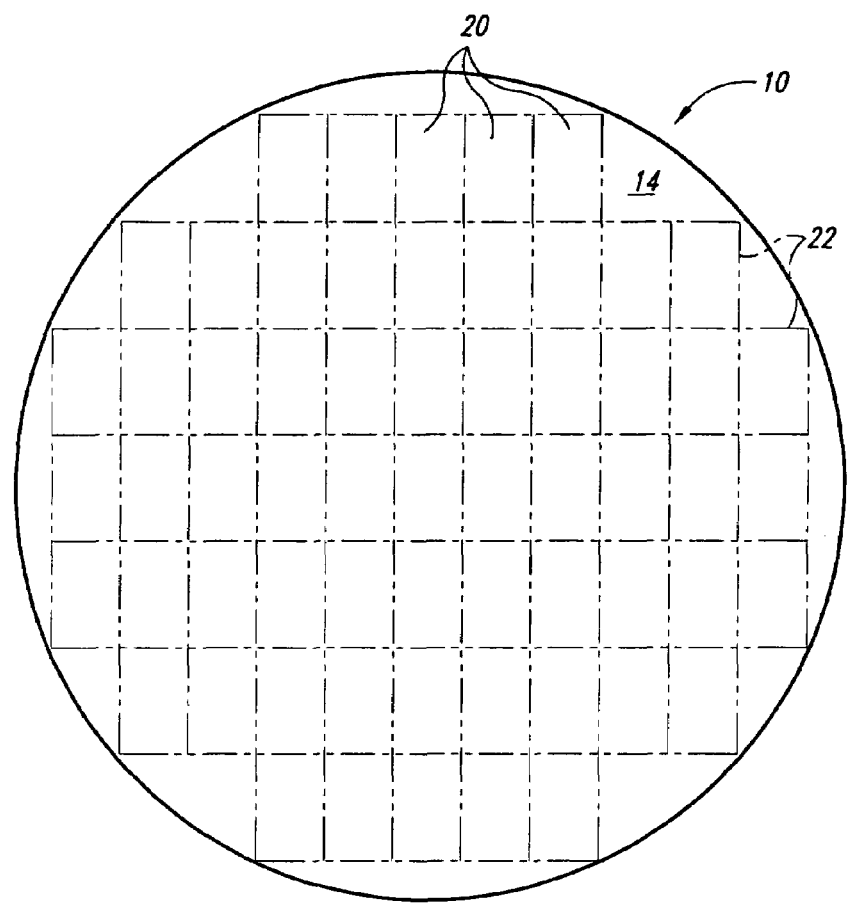
FIGS. 2A and 2B are rear and side elevational views, respectively, of a microelectronic wafer.

FIG. 2A illustrates a microelectronic wafer 10 having an active surface 12 and a rear surface 14. The wafer 10 may comprise a plurality of microelectronic components 20. For example, the wafer 10 may comprise a semiconductor wafer and each of the microelectronic components 20 may comprise a semiconductor die. Such semiconductor wafers are commonly manufactured as 200 mm or 300 mm discs with a plurality of semiconductor dies arranged in an array on the disc. The microelectronic components 20 may be positioned near one another. Commonly, adjacent semiconductor dies are spaced from one another a distance sufficient to accommodate the width of a saw used to cut the wafer 10 into individual microelectronic components 20. These spaces are commonly aligned with one another to facilitate cutting with a wafer saw, defining so-called "streets" 22 between the microelectronic components 20. Such microelectronic wafers 10 and their methods of manufacture are well known in the art and need not be detailed here.

Figure 2B:
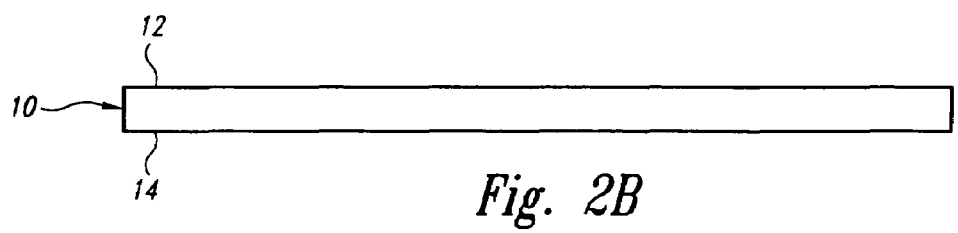
Figure 3A:
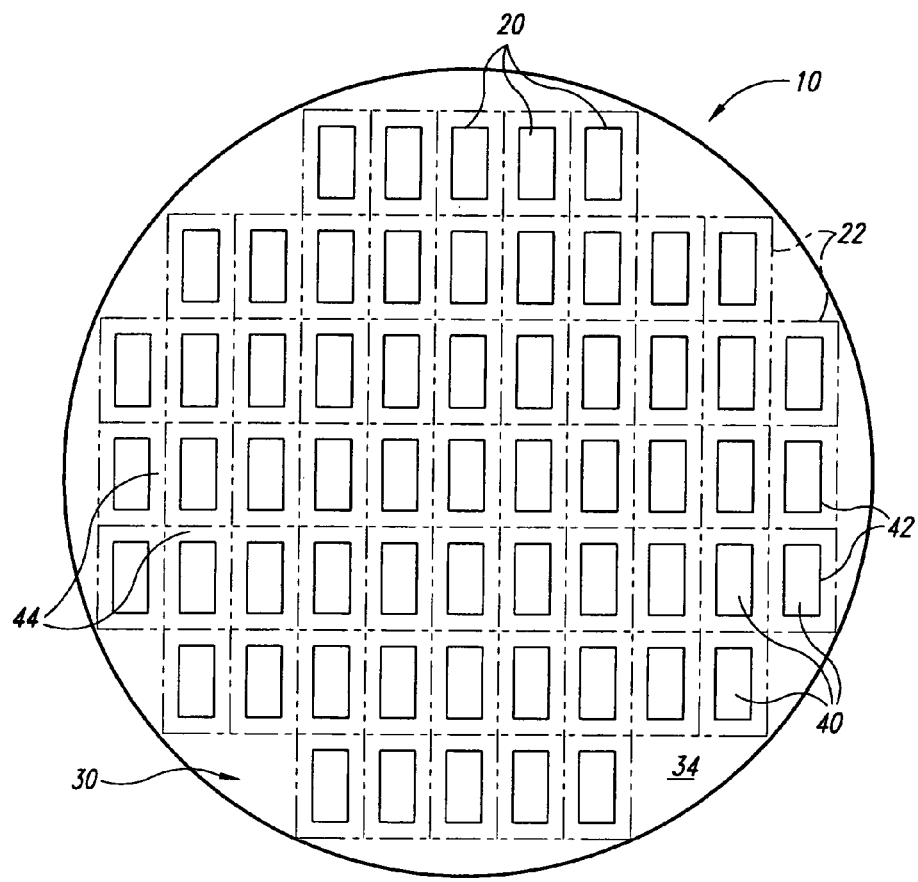
FIGS. 3A and 3B are rear and side elevational views, respectively, of the microelectronic wafer of FIG. 2 bearing an adhesive layer.
Figure 3B:
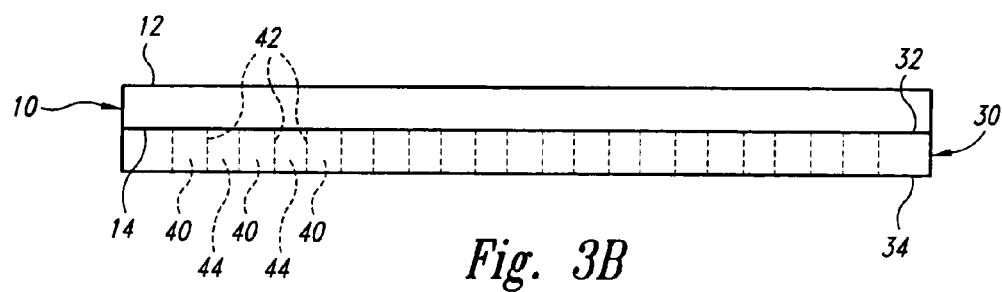

FIGS. 3A–B are rear and side elevational views, respectively, of the wafer 10 of FIG. 2 with an adhesive layer 30 applied on the rear surface 14 of the wafer 10. The adhesive layer 30 has a first surface 32 which may be in direct contact with the rear surface 14 of the wafer 10 and a second surface 34 which is oriented away from the wafer 10. The adhesive layer 30 desirably covers the back surfaces of at least two adjacent microelectronic components 20 and the street 22 disposed therebetween. In one embodiment, the adhesive layer 30 covers the entire back surface of all of the microelectronic components 20 of the wafer 10, but need not cover areas of the rear surface 14 of the wafer 10 which do not comprise a back surface of a microelectronic component 20. In the embodiment shown in FIGS. 3A–B, the adhesive layer 30 covers the entire rear surface 14 of the wafer 10. The adhesive layer first surface 32 may be coextensive with the wafer rear surface 14.

The adhesive layer 30 comprises a plurality of separable adhesive pads 40 spaced from one another in a predetermined array. Adhesive pads 40 are spaced from one another by boundaries 44 of a predetermined width. The boundaries 44 may be discrete from one another. In the illustrated embodiment, the adhesive boundaries 44 are joined in a continuous structure defining a grid between the adhesive pads 40.

For reasons explained below, the adhesive pads 40 should be fairly readily separable from the rest of the adhesive layer 30. In one embodiment, this is accomplished by forming the adhesive pads 40 of a different material than the remainder of the adhesive layer 30. In the illustrated embodiment, the adhesive pads 40 have peripheries defined by cuts 42 in the adhesive layer. In one embodiment, these cuts extend through substantially the entire thickness of the adhesive layer, extending from the first surface 32 to the second surface 34 of the adhesive layer 30. The cuts 42 may be continuous, providing an essentially complete separation between the pads 40 and the adjacent boundaries 44. In other embodiments, the cuts 42 may extend through less than the entire thickness of the adhesive layer 30. In still other embodiments, the cuts 42 may be discontinuous, defining the peripheries of the pads 40 as a series of perforations along which the adhesive layer 30 may be readily broken to remove the pads 40 from the remainder of the adhesive layer 30.

The array of separable, spaced-apart adhesive pads 40 can be defined in any desired fashion. In one embodiment, the adhesive layer 30 is applied to the rear surface 14 of the wafer 10 as a monolithic, continuous layer. After the adhesive layer 30 is applied to the wafer rear surface 14, the adhesive pads 40 can be formed in the adhesive layer 30, such as by cutting the adhesive layer 30 to define the peripheral cuts 42. This can be accomplished in any known fashion, such as by using lasers or photochemical processes. If the adhesive layer 30 is cut with a wafer saw, the cuts 42 may comprise a series of parallel chords (not shown) which intersect one another to define the peripheries of the adhesive pads 40. This will also cut the remainder of the adhesive layer 30 into a series of discrete boundaries 44 rather than the continuous, grid-like arrangement shown in FIG. 3A.

In an alternative embodiment, the adhesive pads 40 are defined in the adhesive layer 30 before the adhesive layer 30 is applied to the wafer rear surface 14. This permits mass production of adhesive material having pre-formed adhesive pads 40 defined therein, minimizing the chances of damage to the wafer 10 in the process of forming the cuts 42 after application of the adhesive layer 30 to the wafer 10. If the cuts 42 are continuous and extend through the entire thickness of the adhesive layer 30, it may desirable to carry the adhesive layer 30 on a liner (not shown). The liner may be attached to the second surface 34 of the adhesive layer 30 to hold the adhesive pads 40 in place with respect to the remainder of the adhesive layer 30. If the cuts 42 comprise discontinuous perforations, such a liner may be unnecessary.

As suggested in FIG. 3A, the adhesive pads 40 are arranged in an array which is modeled after the arrangement of the microelectronic components 20 on the wafer 10. In particular, each adhesive pad 40 may be in contact with the back surface of one of the microelectronic components 20. In one embodiment, none of the adhesive pads 40 are in contact with the back surfaces of more than one microelectronic component 20. The adhesive boundaries 44 between adjacent adhesive pads 40 may be generally aligned with the streets 22 of the wafer 10. In the illustrated embodiment, each of the boundaries 44 is wider than the street 22 with which it is aligned. As a consequence, each of the adhesive pads 40 has a periphery which is spaced inwardly from the periphery of the microelectronic component 20 to which it is attached. Since the adhesive pads 40 do not cover the entire back surface of the microelectronic components 20 to which they are attached, each microelectronic component 20 has a back surface area which is greater than the contact area between the adhesive pad 40 and the back surface of the microelectronic component 20.

The widths of the boundaries 44 and, hence, the distance which the microelectronic component 20 extends outwardly beyond the periphery of the associated adhesive pad 40, will vary depending on the particular application. In one embodiment, the size of the adhesive pad 40 is chosen to permit it to be attached to the active surface of another microelectronic component without interfering with the electrical contacts on that active surface. For example, in the context of FIG. 1, the adhesive pad 40 may be used instead of the adhesive layer 145 between the two microelectronic components. In this context, the boundaries of the adhesive pad 40 will be selected so that the adhesive pad 40 could be attached to the active surface 134 of the first microelectronic component 130 without covering the electrical contacts 136.

The adhesive pads 40 may serve as an adhesive layer to connect one of the microelectronic components 20 to another microelectronic component (not shown in FIGS. 3A–B) in a stacked microelectronic device. As such, the material of the adhesive pad 40 should be compatible with the microelectronic components 20 of the wafer 10 and the other microelectronic components to which the pads will be attached. The adhesive material should also be mechanically and chemically stable under the anticipated conditions of use, though some adhesive materials known in the art may require thermal or other curing processes to yield the final desired characteristics. In one embodiment particularly useful in connection with the process outlined below in connection with FIGS. 5A–7, for example, the adhesive layer 30 (and the adhesive pads 40 defined therein) are formed of a material which is curable by radiation and may also require a secondary thermal cure to yield the final desired adhesive pad 40.

The adhesive layer 30 can be applied at any suitable thickness. As noted above and explained more fully below, the adhesive pads 40 may serve as a spacer between microelectronic components in a stacked microelectronic device. The thickness of the adhesive pads 40 may be selected to ensure adequate clearance between the active surface of the underlying microelectronic component (e.g., surface 134 of the first microelectronic component in FIG. 1) and the back surface of the microelectronic component to which it is attached to avoid interference between the microelectronic component 20 and bonding wires (e.g., 138 in FIG. 1) attached to the underlying microelectronic component. The thickness will depend on the loop height of those bonding wires. In one embodiment, the adhesive layer 30 has a thickness of about 6 mils.

As shown in FIG. 4, a mounting member 50 may be brought into contact with the second surface 34 of the adhesive layer 30. In one embodiment, the second surface 34 of the adhesive layer 30 is adhered to a mounting surface 52 of the mounting member 50, effectively connecting the wafer 10 to the mounting member 50. The mounting member 50 may comprise a conventional, commercially available dicing tape. In conventional microelectronic component manufacture, a wafer may be attached to a dicing tape before the wafer is cut to "singulate" individual microelectronic components. Such dicing tapes typically comprise flexible polymeric films.

Figure 4A:
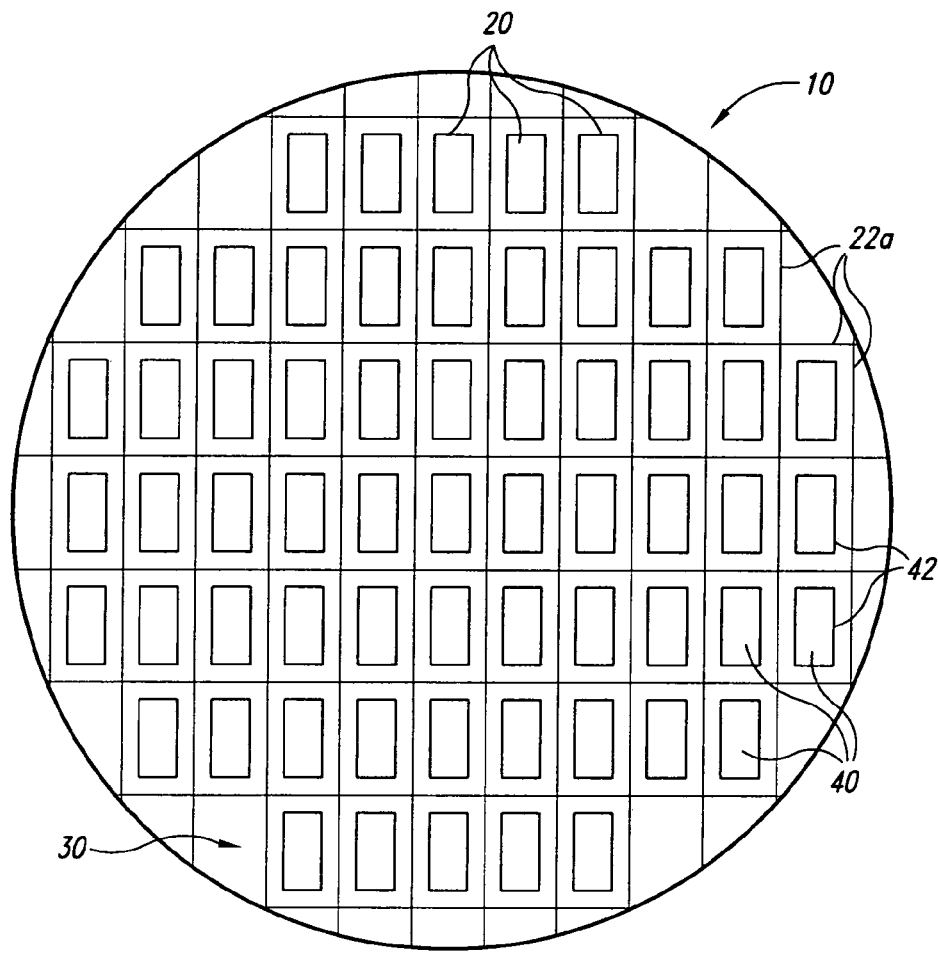
FIGS. 4A and 4B are rear and side elevational views, respectively, of the wafer and adhesive layer of FIG. 3 bearing a compound mounting member in accordance with one embodiment of the invention.
Figure 4B:
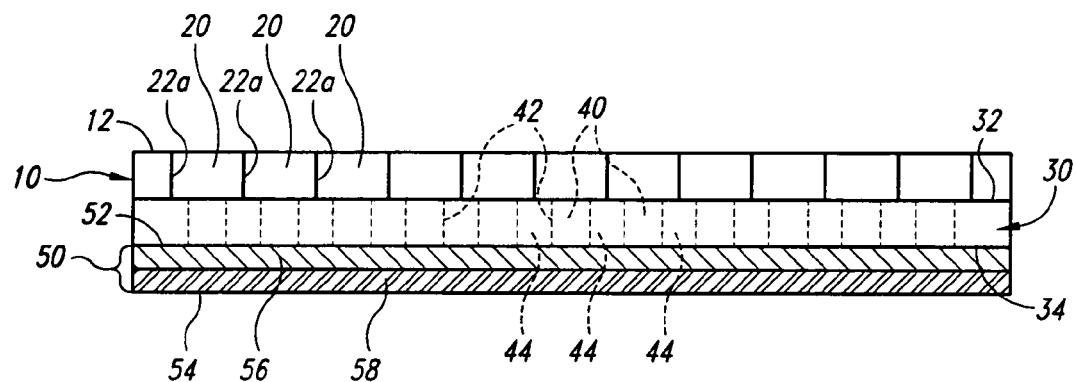

In the embodiment shown in FIG. 4B, the mounting member 50 comprises a backing layer 58 which defines the exterior surface 54 of the mounting member 50 and a release layer 56 which defines the mounting surface 52. The release layer 56 is selected to control the adherence between the adhesive layer 30 and the mounting member 50. In particular, the adherence between the adhesive layer 30 and the release layer 56 should be sufficient to enable the wafer 10 to be handled and diced using conventional equipment, but should allow singulated microelectronic components 20, with the adhesive pad 40 attached thereto, to be lifted away from the mounting member 50 with conventional handling equipment, such as that mentioned below in connection with FIG. 7.

As shown in FIGS. 4A–B, the wafer 10 may be diced after the adhesive layer 30 is attached to the mounting member 50. The wafer 10 may be diced in a conventional fashion, such as by scribing cuts 22a in the wafer using a conventional wafer saw. The cuts 22a may follow along the path of the streets (22 in FIG. 3A) between adjacent microelectronic components, as is conventional in the art.

The cuts 22a desirably pass through substantially the entire thickness of the wafer 10, but are spaced from the mounting member 50. In the embodiment shown in FIG. 4B, the cuts 22a extend through the thickness of the wafer 10, but do not extend appreciably into the adhesive layer 30. Because the boundaries 44 between adjacent adhesive pads 40 are aligned with the wafer streets (22 in FIG. 3A), cutting to a depth spaced from the mounting member 50 will leave the boundaries 44 between adjacent adhesive pads 40 largely intact. This facilitates removal of the adhesive pads 40 with the microelectronic components 20 to which they are attached while leaving the remainder of the adhesive layer 30 (including the boundaries 44) attached to the mounting member 50.

FIGS. 5A–6B illustrate an alternative embodiment of the invention. In accordance with this embodiment, the second surface 34 of the adhesive layer 30 is brought into contact with a different mounting member 60. Whereas the mounting member 50 (FIG. 3B) has a multi-layer structure, the mounting member 60 (FIG. 6B) may have a single monolithic layer which extends from the mounting surface 62 to the exterior surface 64. The mounting member 60 of FIG. 5B may have a relatively high transmissivity of a selected treatment radiation, e.g., ultraviolet (UV) radiation, and is relatively stable under exposure to that radiation.

In accordance with the process outlined in FIGS. 5A–6B, a mask 70 is positioned between the mounting member 60 and a radiation source 75. The mask 70 has a body 72 and a plurality of orifices or windows 74 therethrough. These windows 74 are arranged to align with the either the adhesive pads 40 or the boundaries 44 of the adhesive layer 30. In the illustrated embodiment, the windows 74 are arranged to align with the adhesive pads 40 and the body 72 of the mask 70 is designed to align with the boundaries 44 between the adhesive pads 40.

The windows 74 are adapted to transmit radiation from the radiation source 75 while the body 72 limits passage of that radiation. This permits the areas of the adhesive layer 30 aligned with the windows 74 to be selectively exposed to the radiation from the radiation source 75.

The material of the adhesive layer 30 may be selected to change properties in response to exposure to radiation from the radiation source 75. This may be done, for example, to alter the properties of the adhesive pads 40 to better bond the adhesive pads to the wafer rear surface 14 or to facilitate defining the adhesive pads 40 or their removal from the remainder of the adhesive layer 30.

In one particular embodiment of the invention, adhesion between the adhesive layer 30 and the mounting member 60 is altered by exposure to radiation from the radiation source 75. By positioning the mask 70 between the radiation source 75 and the adhesive layer 30, the adhesive layer 30 may be selectively exposed to yield a first adherence between the mounting member 60 and the second surfaces 34 of the adhesive pads 40, and a second, greater adherence between the second surface 34 of the remainder of the adhesive layer 30 and the mounting member 60.

In one embodiment, the adhesive layer 30 is a UV- or visible light-curable adhesive material and the radiation source 75 emits radiation of a wavelength adapted to cure the adhesive 30. A variety of suitable adhesive materials are commercially available. These adhesive materials are commonly employed to provide a high level of adhesion between a wafer and a backing tape, for example, during ordinary handling, yet permit ready removal of the backing tape by exposure to an appropriate wavelength of radiation. Adhesives expected to be suitable for this purpose include ABLELUX "UV/visible curable" or "UV/visible/secondary thermal curable" adhesives, sold by Ablestik Laboratories of Rancho Dominguez, Calif., USA; UV200 and UV500 adhesives available from Al Technology of Princeton Junction, N.J., USA; and D-SERIES adhesives available from Lintec Corporation of Tokyo, Japan.

Figure 5A:
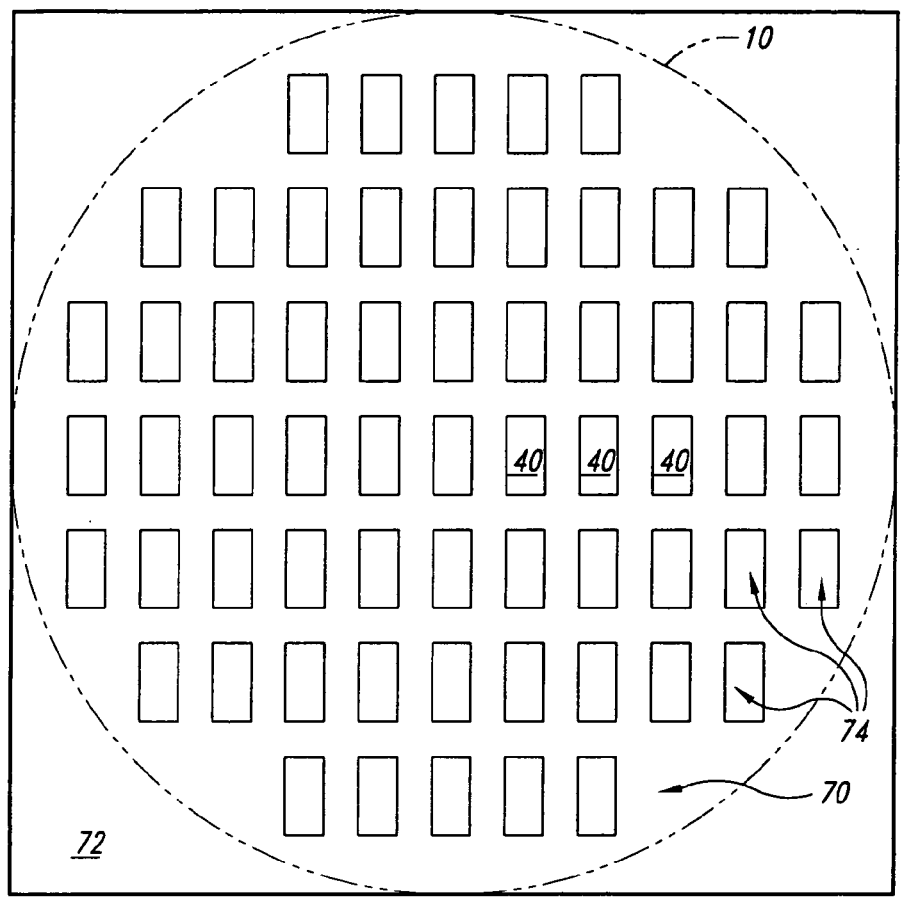
FIGS. 5A and 5B are rear and side elevational views, respectively, of the wafer and adhesive layer of FIG. 3 further including a mounting member and a mask in accordance with another embodiment of the invention.
Figure 5B:
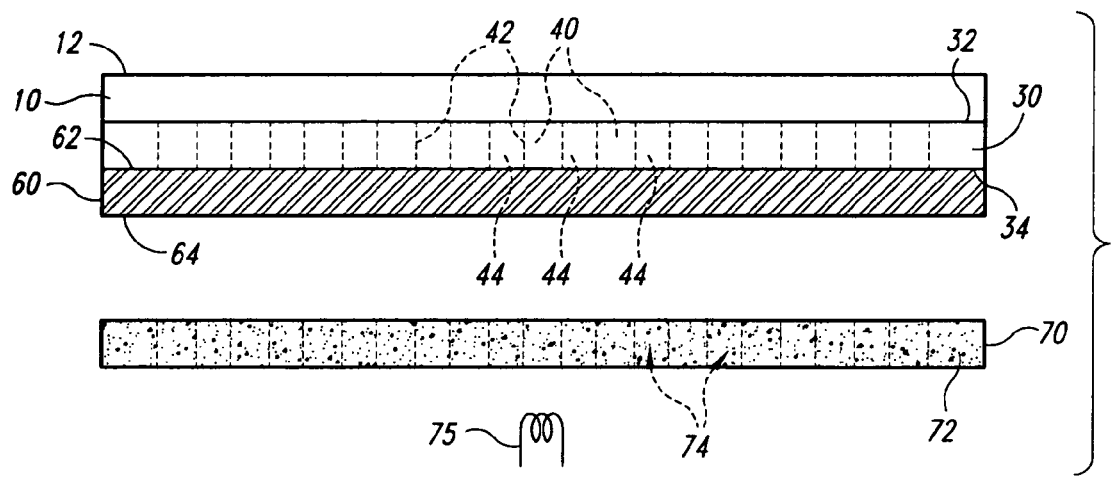
Figure 6A:
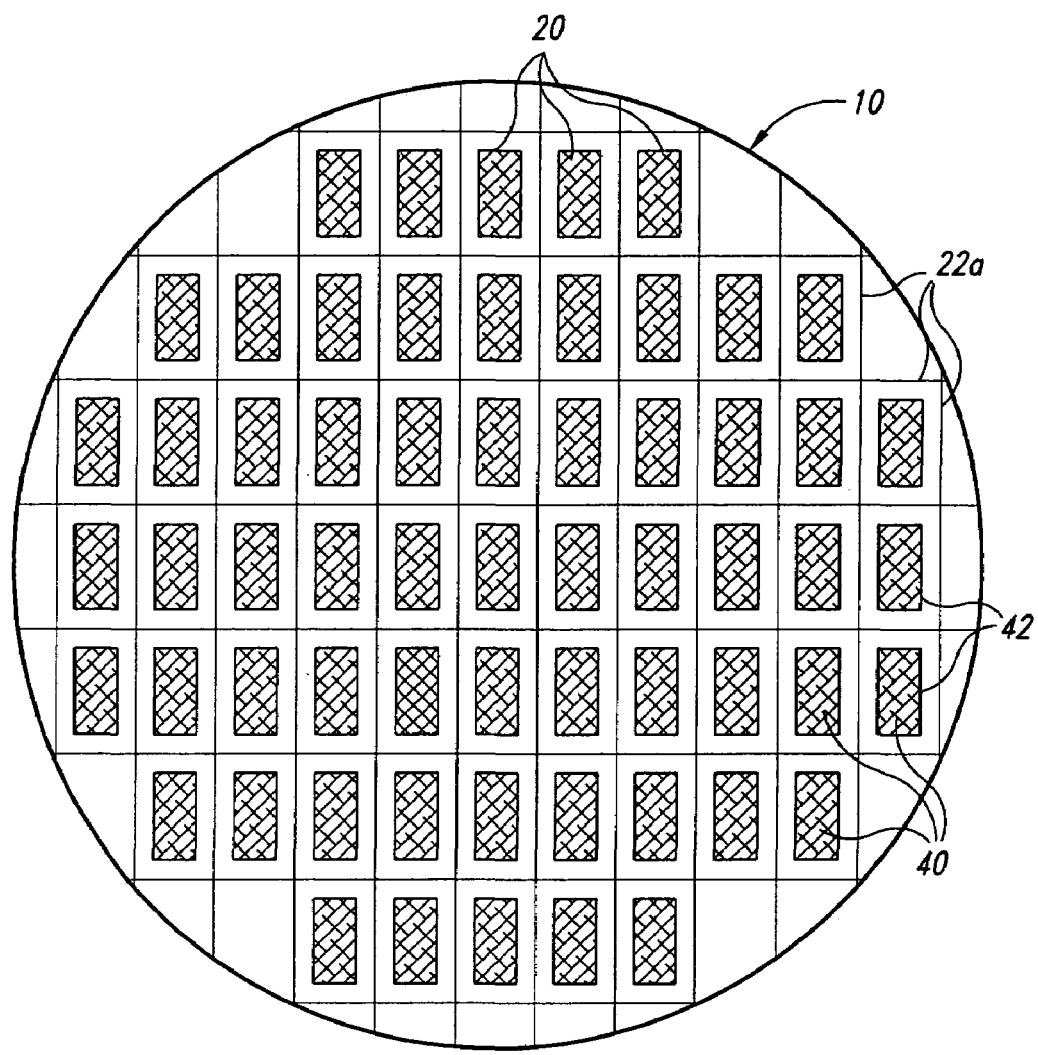
FIGS. 6A and 6B are rear and side elevational views, respectively, of the subassembly of FIG. 5 schematically representing the adhesive layer after treatment through the mask.
Figure 6B:
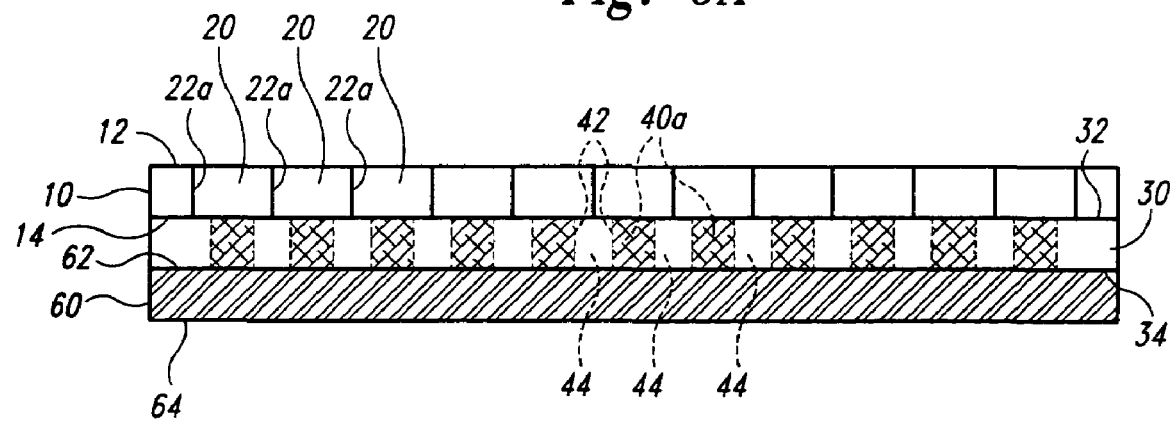

FIGS. 6A–B schematically illustrate the subassembly of FIGS. 5A–B after exposure by the radiation source 75 through the mask 70. The adhesive pads in FIGS. 6A–B are designated by reference number 40a and are crosshatched to schematically signify the change induced by exposure to the radiation source 75.

FIGS. 6A–6B illustrate the wafer 10 wherein the microelectronic components 20 have been separated by cuts 22a along the streets (22 in FIG. 3A) of the wafer 10. As with the embodiment of FIG. 4A, the cuts 22a used to dice the wafer 10 stop short of cutting through the entire thickness of the adhesive layer 30. In the illustrated embodiment, the cuts 22a extend through the thickness of the wafer without cutting into the adhesive layer 30 at all.

Figure 7:
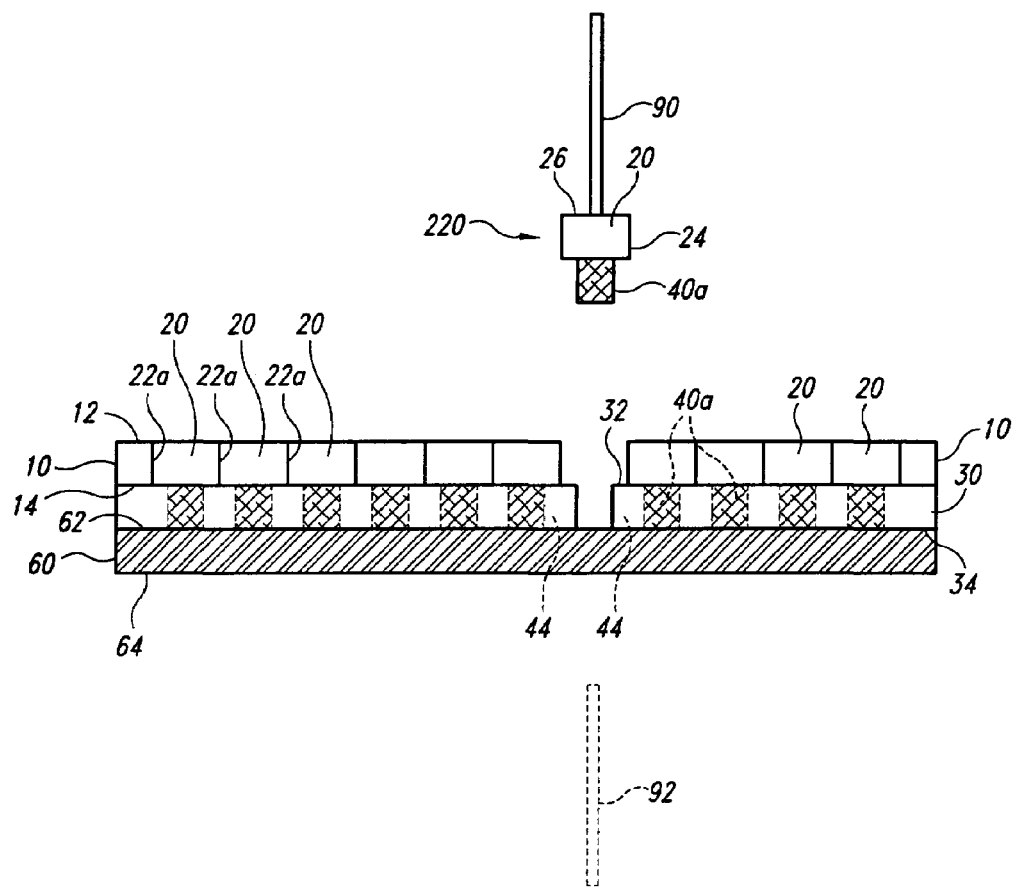
FIG. 7 is a side elevational view schematically illustrating a stage in processing a microelectronic component in accordance with a further embodiment of the invention.

FIG. 7 schematically illustrates removal of an individual microelectronic component 20 and its associated adhesive pad 40a from the diced wafer 10. As is known in the art, the active surface 26 of a microelectronic component 20 may be contacted with a vacuum tip 90 to suctorially grasp an individual microelectronic component 20. As the microelectronic component 20 is lifted away from the mounting member 60, the adhesive pad 40a attached to the back surface 24 of the microelectronic component 20 will be lifted with the microelectronic component 20. In the illustrated embodiment, selectively exposing the adhesive pads 40 to the radiation source 75 (FIG. 5B) renders the mounting member 60 less adherent to the adhesive pads 40a than to the boundaries 44 between the adhesive pads 40a. This facilitates removal of the microelectronic component 20 with the adhesive pads 40a while leaving the boundary areas 44 of the adhesive layer 30 attached to the mounting member 60.

It is not necessary to expose the adhesive layer 30 to radiation or otherwise treat the adhesive layer 30 to render the adhesive pads 40 relatively less adherent to the mounting member 60. If a multi-layer mounting member 50 with a release liner 56 (FIG. 4B) is employed, for example, it may be possible to simply lift the diced microelectronic component 20 with the untreated adhesive pad 40 attached, leaving the rest of the adhesive layer 30 in place. If so desired, a plunger 92 may be urged upwardly against the exterior surface 64 of the mounting member 60 (or exterior surface 54 of the mounting member 50 of FIG. 4B) to locally deform the mounting member 60 and facilitate selective detachment of the adhesive pad 40 from the mounting member 60. Such a plunger 92 can also be used in connection with embodiments of the invention wherein the adhesive layer 30 is selectively exposed to reduce adherence of the adhesive pads 40a to the mounting member 60 as suggested in FIG. 7.

This process may be continued for each of the diced microelectronic components 20. At the end of process, each of the adhesive pads 40a will be removed with the microelectronic components 20 to which they are attached. This will leave a remainder of the adhesive layer 30, including the boundaries 44 which separated the spaced-apart adhesive pads 40a, attached to the mounting member 60.

As shown in FIG. 7, the vacuum tip 90 can remove a single microelectronic component 20 with an attached adhesive pad 40a. This adhesive pad 40 may have a periphery spaced inwardly from the periphery of the microelectronic component 20. This is an excellent expedient for the manufacture of stacked microelectronic devices. As noted above in connection with FIG. 1, current techniques require high-precision placement of a small adhesive layer 145 on the active surface 134 of an individual microelectronic component 130. The process of applying these individual adhesive layers 145 can be a manufacturing bottleneck and can increase product losses due to relatively small errors in adhesive layer placement.

Embodiments of the present invention greatly streamline the process of applying and positioning an adhesive which can be used to stack microelectronic components. By applying the adhesive layer 30 to the wafer 10 before the individual microelectronic component 20 are singulated, adhesive pads 40 can be attached in a batch process to a large number of microelectronic components 20. This yields a stackable component subassembly (220 in FIG. 7) which includes a microelectronic component 20 and the attached adhesive pad 40. This subassembly 220 can be positioned with respect to another microelectronic component (e.g., 130 in FIG. 1) of a stacked microelectronic device. The adhesive pad 40 can then be used to join the microelectronic component 20 to the underlying microelectronic component and as a spacer to avoid damage to any bonding wires (138 in FIG. 1) attached to the underlying microelectronic component (130 in FIG. 1).

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A microelectronic subassembly, comprising:
a microelectronic wafer having an active surface and a rear surface, the wafer comprising a plurality of microelectronic components, each of which has a back surface, and a plurality of streets between the microelectronic components;
an adhesive layer having a first surface in contact with the rear surface of the wafer and covering the back surfaces of the plurality of microelectronic components, the adhesive layer comprising an array of separable adhesive pads spaced by adhesive boundaries, each adhesive pad being in contact with the back surface of one of the microelectronic components and each adhesive boundary being aligned with at least one of the streets of the wafer.

2. The microelectronic subassembly of claim 1 wherein the adhesive pads have peripheries defined by cuts in the adhesive layer.

3. The microelectronic subassembly of claim 2 wherein the cuts extend through substantially an entire thickness of the adhesive layer.

4. The microelectronic subassembly of claim 2 wherein the cuts define perforations between the adhesive pads and the adhesive boundaries.

5. The microelectronic subassembly of claim 1 wherein the adhesive boundaries are joined in a continuous structure defining a grid between the adhesive pads.

6. The microelectronic subassembly of claim 1 wherein the adhesive pads and the adhesive boundaries comprise the same material applied as a continuous adhesive layer and subsequently cut to define the adhesive pads and the adhesive boundaries.

7. The microelectronic subassembly of claim 1 wherein each of the microelectronic components has a back surface, each adhesive pad covering less than the entire back surface of the microelectronic component to which it is adhered.

8. The microelectronic subassembly of claim 1 wherein the adhesive layer has a second surface oriented away from the wafer, further comprising a mounting member in contact with the second surface of the adhesive layer.

9. The microelectronic subassembly of claim 8 wherein the mounting member comprises a backing tape and a release liner, the release liner being carried between the backing tape and the adhesive layer.

10. The microelectronic subassembly of claim 8 wherein the mounting member is less adherent to the adhesive pads than to the adhesive boundaries.

11. The microelectronic subassembly of claim 8 wherein the adhesive layer comprises a radiation-sensitive material adapted to change adherence to the mounting member in response to exposure to radiation.

12. The microelectronic subassembly of claim 8 wherein the adhesive layer comprises a radiation-sensitive material which reduces adherence to the mounting member in response to exposure to radiation.

13. A microelectronic subassembly, comprising:
a microelectronic wafer comprising a plurality of microelectronic components, the wafer having a rear surface;
a mounting member having a mounting surface oriented toward the rear surface of the wafer; and
an adhesive layer having a first surface adhered to the rear surface of the wafer and a second surface adhered to the mounting surface of the mounting member, the adhesive layer comprising a plurality of adhesive pads separated by adhesive boundaries, each of the adhesive pads being adhered to one of the microelectronic components, the mounting member being less adherent to the adhesive pads than to the adhesive boundaries.

14. The microelectronic subassembly of claim 13 wherein the adhesive pads have peripheries defined by cuts in the adhesive layer.

15. The microelectronic subassembly of claim 14 wherein the cuts extend through substantially an entire thickness of the adhesive layer.

16. The microelectronic subassembly of claim 14 wherein the cuts define perforations between the adhesive pads and the adhesive boundaries.

17. The microelectronic subassembly of claim 13 wherein the adhesive boundaries are joined in a continuous structure defining a grid between the adhesive pads.

18. The microelectronic subassembly of claim 13 wherein the adhesive pads and the adhesive boundaries comprise the same material applied as a continuous adhesive layer and subsequently cut to define the adhesive pads and the adhesive boundaries.

19. The microelectronic subassembly of claim 13 wherein the mounting member comprises a backing tape and a release liner, the release liner being carried between the backing tape and the adhesive layer.

20. The microelectronic subassembly of claim 13 wherein the adhesive layer comprises a radiation-sensitive material adapted to change adherence to the mounting member in response to exposure to radiation.

21. The microelectronic subassembly of claim 13 wherein the adhesive layer comprises a radiation-sensitive material which reduces adherence to the mounting member in response to exposure to radiation.

22. The microelectronic subassembly of claim 13 wherein each of the microelectronic components has a back surface, each adhesive pad covering less than the entire back surface of the microelectronic component to which it is adhered.

23. The microelectronic subassembly of claim 13 wherein each of the microelectronic components has a back surface having a back surface area, each adhesive pad having a contact area in contact with the back surface of one of the microelectronic components, the contact area being less than the back surface area of the microelectronic component to which it is adhered.

* * * * *